United States Patent
Tanaka et al.

(10) Patent No.: US 7,315,597 B2
(45) Date of Patent: Jan. 1, 2008

(54) SAMPLING FREQUENCY CONVERSION DEVICE AND SAMPLING FREQUENCY CONVERSION METHOD

(75) Inventors: Yoshiyuki Tanaka, Kanagawa-ken (JP);
Yoshinari Ojima, Kanagawa-ken (JP);
Jun Wakasugi, Kanagawa-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 680 days.

(21) Appl. No.: 10/852,236

(22) Filed: May 25, 2004

(65) Prior Publication Data
US 2005/0007863 A1    Jan. 13, 2005

(30) Foreign Application Priority Data
Jun. 9, 2003    (JP)    ............................ P2003-163658

(51) Int. Cl.
*H04L 7/00*    (2006.01)
(52) U.S. Cl. ..................................... 375/355
(58) Field of Classification Search ................. 375/355
See application file for complete search history.

(56) References Cited

U.S. PATENT DOCUMENTS 5,973,990 A * 10/1999 Sakurai .................... 365/233
6,160,542 A    12/2000 Hwang
6,239,635 B1 *  5/2001 Matsuzaki ................... 327/160
6,636,165 B2 * 10/2003 Freidhof ....................... 341/61

FOREIGN PATENT DOCUMENTS

JP    61-204700    9/1986

* cited by examiner

*Primary Examiner*—David C. Payne
*Assistant Examiner*—Rahel Guarino
(74) *Attorney, Agent, or Firm*—Oblon, Spivak, McClelland, Maier & Neustadt, P.C.

(57) ABSTRACT

A sampling frequency conversion device comprises an internal circuit for executing in synchronization with an internal clock a signal processing of input data fetched in accordance with an input word clock, and for outputting the input data having undergone the signal processing as output data, a clock generation circuit for generating from the internal clock an output word clock and a counter clock having a frequency which is equal to that of the output word clock multiplied by n (n: integer equal to two or more), a counter for counting the counter clock, and a register for holding a counter value of the counter in synchronization with the input word clock, and for outputting the held counter value to the internal circuit.

15 Claims, 14 Drawing Sheets

SAMPLING FREQUENCY CONVERSION DEVICE AND SAMPLING FREQUENCY CONVERSION METHOD

CROSS-REFERENCE TO RELATED APPLICATIONS

This application is based upon and claims the benefit of priority from the prior Japanese Patent Application No. 2003-163658, filed Jun. 9, 2003, the entire contents of which are incorporated herein by reference.

FIELD OF THE INVENTION

The present invention relates to a sampling frequency conversion device for converting a sampling frequency when sampling frequencies on input and output sides are different, and a sampling frequency conversion method of converting the same.

BACKGROUND OF THE INVENTION

When instruments using different frequencies are coupled to each other, it is necessary to convert a sampling frequency of the instrument on a sending side to that of the instrument on a receiving side.

As one of representative techniques on the sampling frequency conversion method, there has been a method in which output data is constructed by over-sampling input data by N times and by thinning out the over-sampled data by 1/M times (for example, Japanese Patent Laid-Open Publication No. Hei 6(1994)-120776, page 2, FIG. 5). M and N are integers. By this sampling frequency conversion method, the input data is converted to a sampling frequency multiplied by N/M.

However, if a sampling frequency ratio of the input data and the output data is not previously known, the above described sampling frequency conversion method is incapable of converting the sampling frequency and of being applied.

As the case where the sampling frequency ratio of the input data and the output data is not known, in an I/O system using a processor for a data processing, thought is a case where a clock for driving the I/O system and a clock for driving an instrument on a sending side to output data to the I/O system are asynchronous.

In such an I/O system, when a sampling frequency of the I/O system and a sampling frequency of the instrument on a sending side are different, a phase shift occurs between input data and output data. This phase shift is accumulated with passage of time, and a shift equivalent to one or more samples occurs between the input data and the output data. Data between the input data and the output data becomes discontinuous.

SUMMARY OF THE INVENTION

A sampling frequency conversion device according to an embodiment of the present invention comprises an internal circuit for executing in synchronization with an internal clock a signal processing of input data fetched in accordance with an input word clock, and for outputting the input data having undergone the signal processing as output data, a clock generation circuit for generating from the internal clock an output word clock and a counter clock having a frequency which is equal to that of the output word clock multiplied by n (n: integer equal to two or more), a counter for counting the counter clock, and a register for holding a counter value of the counter in synchronization with the input word clock, and for outputting the held counter value to the internal circuit.

A sampling frequency conversion device according to another embodiment of the present invention comprises an internal circuit for executing in synchronization with an internal clock a signal processing of input data fetched in accordance with an input word clock, and for outputting the input data having undergone the signal processing as output data, a clock generation circuit for generating from the internal clock an output word clock and a counter clock having a frequency which is equal to that of the output word clock multiplied by n (n: integer equal to two or more), a first counter for counting the counter clock and for subtracting the integer n from a counted counter value in synchronization with the input word clock; and a register for holding the counter value of the first counter in synchronization with the input word clock, and for outputting a flag signal to the internal circuit when the held counter value becomes a value out of a predetermined range.

A sampling frequency conversion method according to an embodiment of the present invention comprises executing in synchronization with an internal clock a signal processing of input data fetched in accordance with an input word clock, and outputting the input data having undergone the signal processing as output data, generating from the internal clock an output word clock and a counter clock having a frequency which is equal to that of the output word clock multiplied by n (n: integer equal to two or more), counting the counter clock, and holding a counter value of the counter clock in synchronization with the input word clock, and outputting the held counter value to an internal circuit.

A sampling frequency conversion method according to another embodiment of the present invention comprises executing in synchronization with an internal clock a signal processing of input data fetched in accordance with an input word clock, and outputting the input data having undergone the signal processing as output data, generating from the internal clock an output word clock and a counter clock having a frequency which is equal to that of the output word clock multiplied by n (n: integer equal to two or more), counting the counter clock and subtracting the integer n from a counted counter value of the counter clock in synchronization with the input word clock, and holding the subtracted counter value of the counter clock in synchronization with the input word clock, and outputting a flag signal to an internal circuit when the held counter value becomes a value out of a predetermined range.

DETAILED DESCRIPTION OF THE INVENTION

First Embodiment

When it is tried to execute all of detections of a phase shift amount and all of data correction processings only by a processor by means of firmware in an I/O system, and when it is tried to execute them every one sample, the processor has to execute many processings within limited time. In this case, if the processor cannot execute all processings within certain time, programs may be damaged.

For the above described circumstance, to operate the processor stably, it is required to reduce a burden on the processor by detecting a phase shift amount effectively and executing a correction processing for data.

A sampling frequency conversion device according to a first embodiment of the present invention will be described with reference to FIGS. 1 to 6 below. Herein, a case where the sampling frequency conversion device according to this embodiment converts input data Di of a sampling frequency fs 1 to output data Do of a sampling frequency fs 2 is shown. A DSP (Digital Signal Processor) is exemplified as an internal circuit incorporated in the sampling frequency conversion device.

Figure 1:
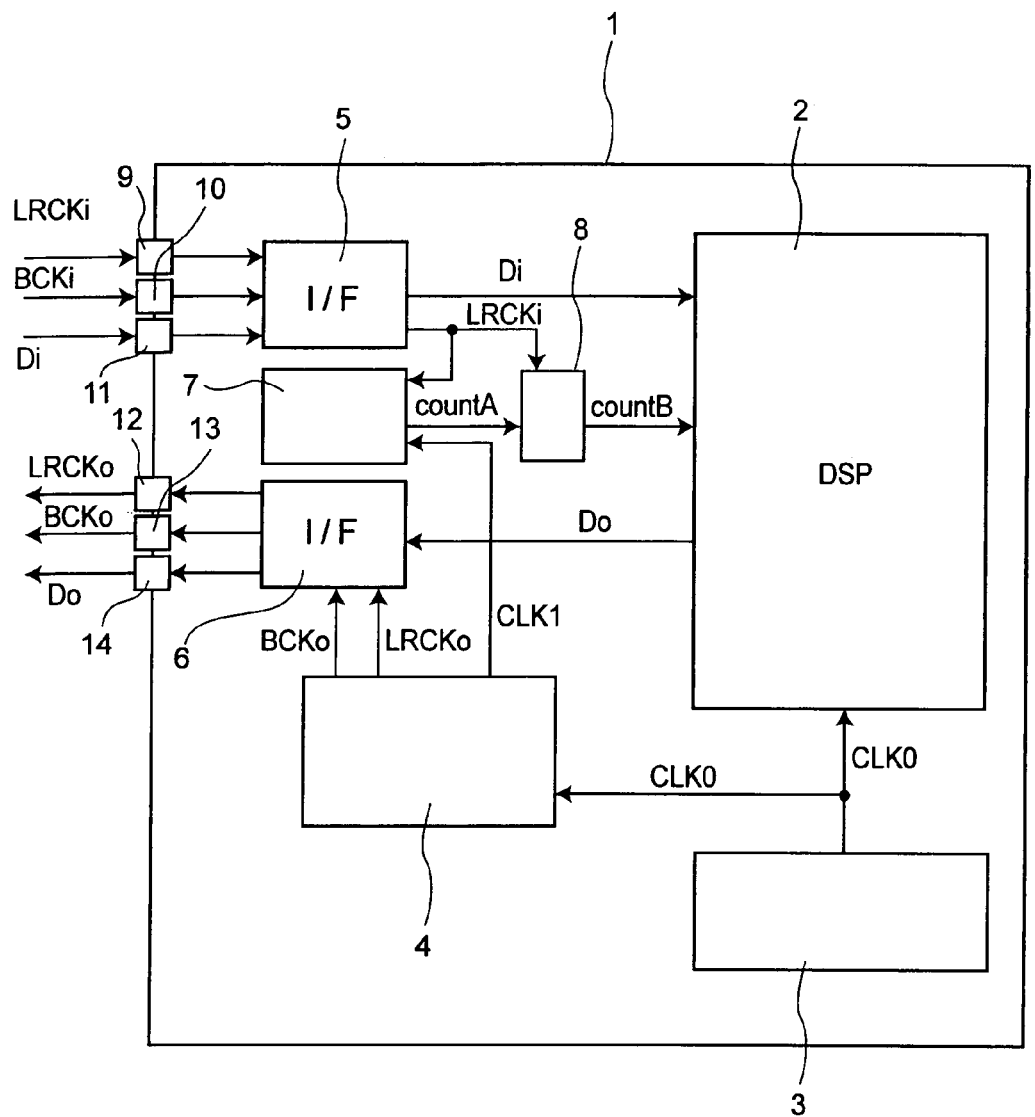
FIG. 1 is a block diagram showing a configuration of a sampling frequency conversion device according to a first embodiment of the present invention.

A configuration of the sampling frequency conversion device according to this embodiment will be described with reference to FIG. 1. FIG. 1 is a block diagram showing the configuration of the sampling frequency conversion device according to this embodiment.

As shown in FIG. 1, sampling frequency conversion device 1 includes a DSP 2, an internal clock generation circuit 3, an I/F section clock generation circuit 4, I/F circuits 5 and 6, a counter 7, a register 8, input terminals 9 to 11, and output terminals 12 to 14.

Input data Di, an input word clock LRCKi, and an input bit clock BCKi are inputted from input terminals 9 to 11 to I/F circuit 5.

The input word clock LRCKi is a clock having a frequency equal to the sampling frequency fs 1. For example, when the input data Di is audio data, it is usually shown that a polarity of the input word clock LRCKi is L and R channels of a stereo. The input bit clock BCKi is a minimum unit clock of the input data Di. For example, when a word length of the input data Di is 32 bits, the input bit clock BCKi is a clock which is equal to the input word clock LRCKi multiplied by 32.

I/F circuit 5 outputs an input word clock LRCKi to register 8. The input data Di inputted to I/F circuit 5 is fetched in DSP 2 in accordance with the input word clock LRCKi and the input bit clock BCKi.

DSP 2 executes a digital signal processing on the input data Di fetched from I/F circuit 5 in synchronization with an internal clock CLK0, and outputs the input data Di having undergone the digital signal processing as the output data Do.

Internal clock generation circuit 3 generates the internal clock CLK0, and outputs it to DSP 2 and I/F section clock generation circuit 4.

I/F section clock generation circuit 4 divides the internal clock CLK0, and generates an output word clock LRCKo, an output bit clock BCKo and a counter clock CLK1. I/F section clock generation circuit 4 outputs the output word clock LRCKo and the output bit clock BCKo to I/F circuit 6, and outputs the counter clock CLK1 to counter 7.

The output word clock LRCKo is a clock having a frequency equal to the sampling frequency fs 2 of the output data Do. The output bit clock BCKo is a minimum unit clock of the output data Do. The counter clock CLK1 is a generation clock of the output word clock LRCKo, and is a clock having a frequency which is equal to the sampling frequency fs 2 multiplied by 256.

The output data Do is inputted to I/F circuit 6 from DSP 2, and the output word clock LRCKo and the output bit clock BCKo are inputted to I/F circuit 6 from I/F section clock generation circuit 4. The output data Do, the output word clock LRCKo and the output bit clock BCKo are outputted from output terminals 12 to 14 in synchronization with each other.

Counter 7 is an 8-bit free-run counter for counting up the counter clock CLK1. Since a frequency of the counter clock CLK1 is equal to that of the output word clock LRCKo multiplied by 256, a counter value countA of counter 7 repeats counts from 0 to 255 at a cycle equal to that of the output word clock LRCKo.

Register 8 fetches the counter value countA of counter 7 in synchronization with a drop of the input word clock LRCKi therein, and holds it as output data countB.

The output data countB of register 8 is inputted to DSP 2, and based on the output data countB, DSP 2 executes a correction processing (thinning-out processing or interpolation processing) of the output data Do. Specifically, in the case where the sampling frequency fs 1 of the input data Di is higher than the sampling frequency fs 2 of the output data Do, DSP 2 executes the interpolation processing for one sample of the output data Do when the input word clock LRCKi advances by one sample ahead of the output word clock LRCKo. On the other hand, in the case where the sampling frequency fs 1 is lower than the sampling frequency fs 2, DSP 2 executes the processing of thinning out one sample from the output data Do, when the input word clock LRCKi is delayed behind the output word clock LRCKo by one sample.

There have been many known technologies concerning the technique on the interpolation processing and the thinning-out processing. For example, the interpolation processing includes a linear interpolation and a two-dimensional interpolation as a mathematical technique. The thinning-out processing is to delete a part of sampled data and to process the sampled data without a sense of incongruity to output it.

Figure 2:
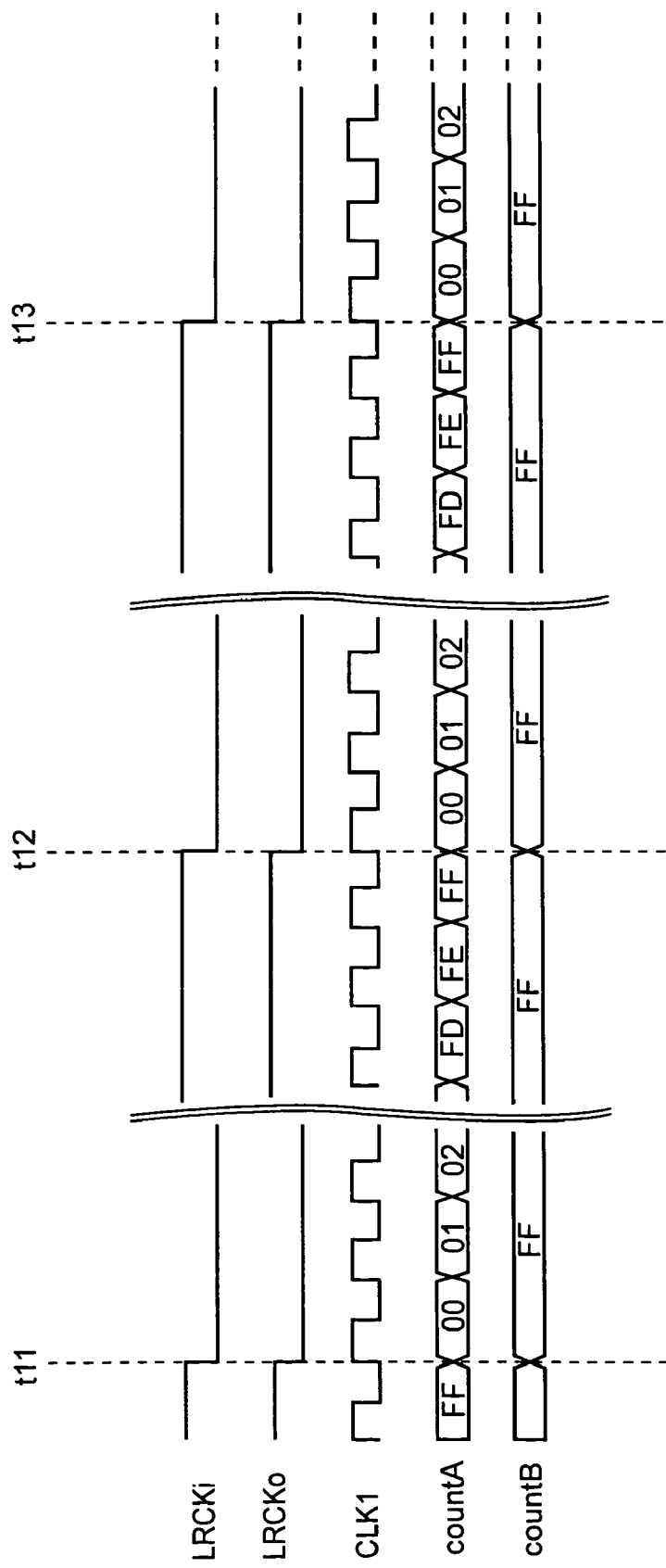
FIG. 2 is a time chart of signals of the sampling frequency conversion device according to the first embodiment of the present invention when a sampling frequency fs 1 is equal to a sampling frequency fs 2.
Figure 3:
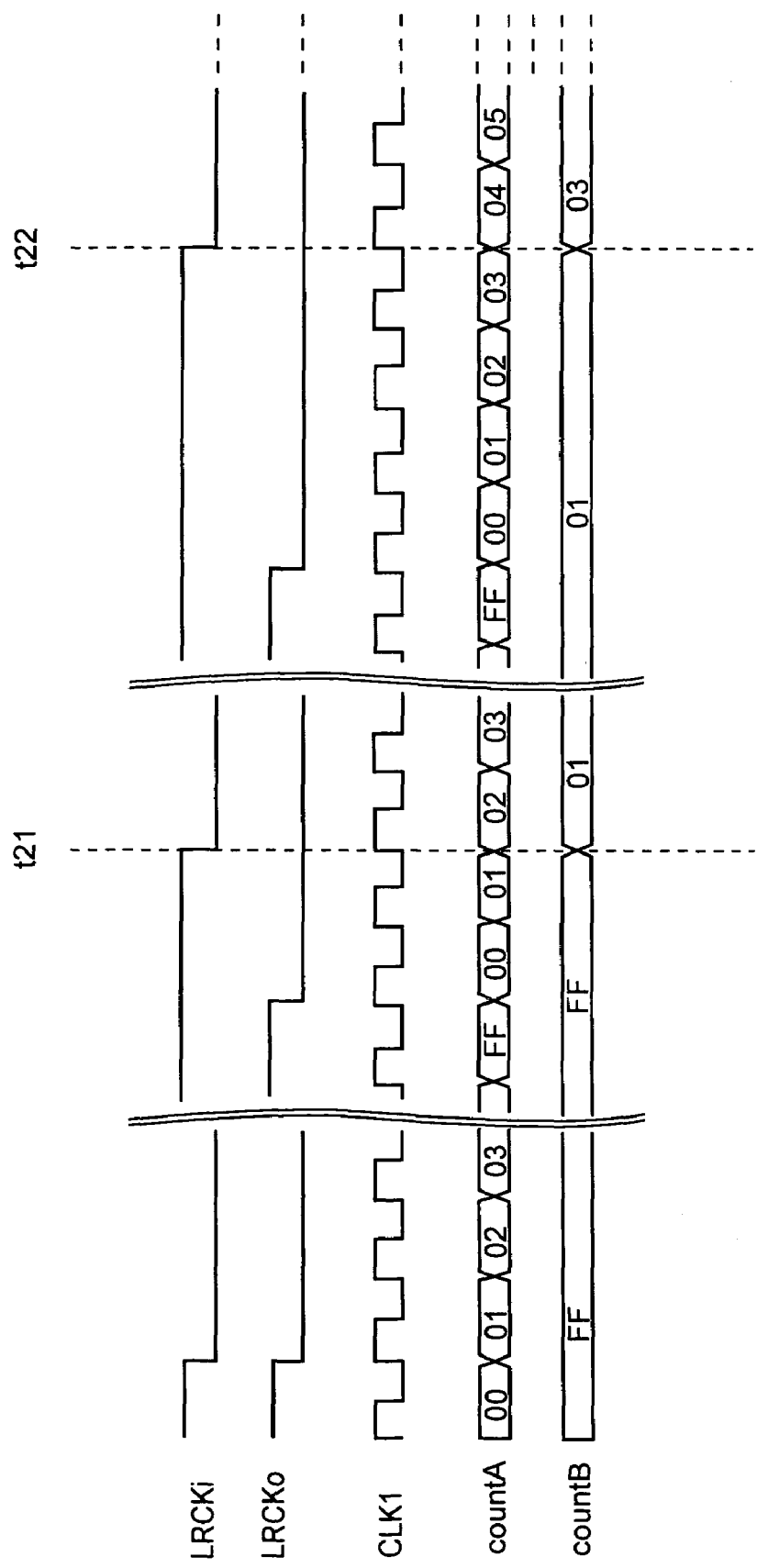
FIG. 3 is a first time chart of the signals of the sampling frequency conversion device according to the first embodiment of the present invention when the sampling frequency fs 1 is lower than the sampling frequency fs 2.
Figure 4:
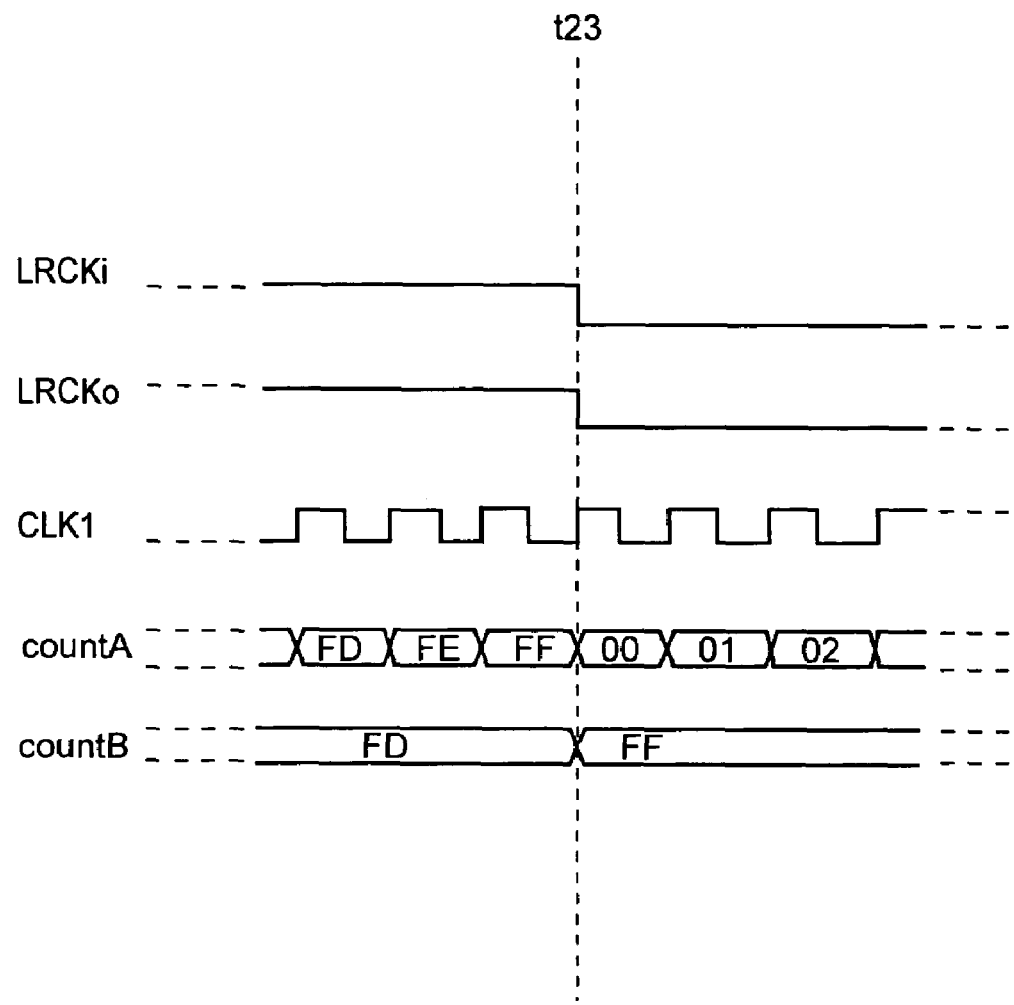
FIG. 4 is a second time chart of the signals of the sampling frequency conversion device according to the first embodiment of the present invention when the sampling frequency fs 1 is lower than the sampling frequency fs 2.
Figure 5:
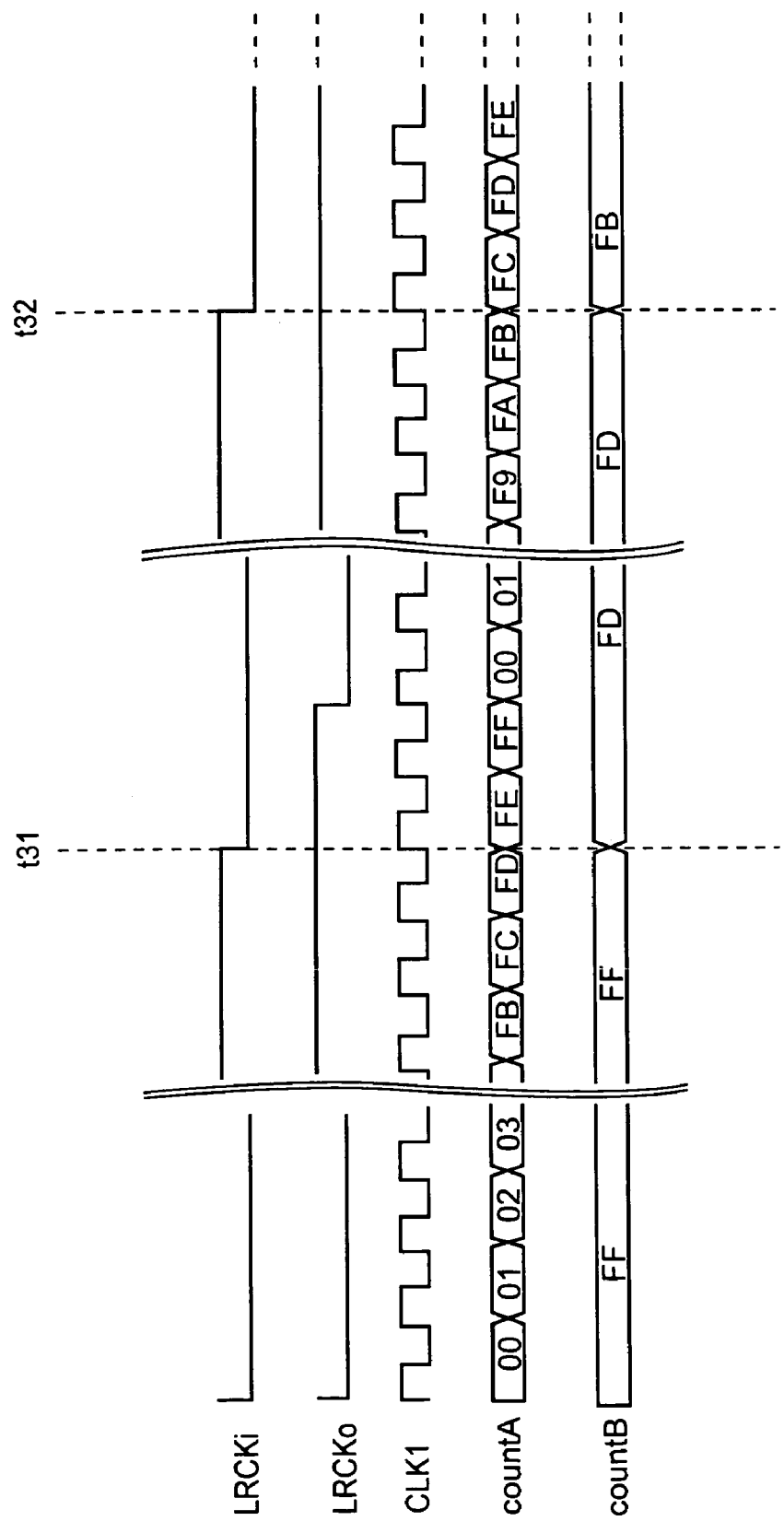
FIG. 5 is a first time chart of the signals of the sampling frequency conversion device according to the first embodiment of the present invention when the sampling frequency fs 1 is higher than the sampling frequency fs 2.
Figure 6:
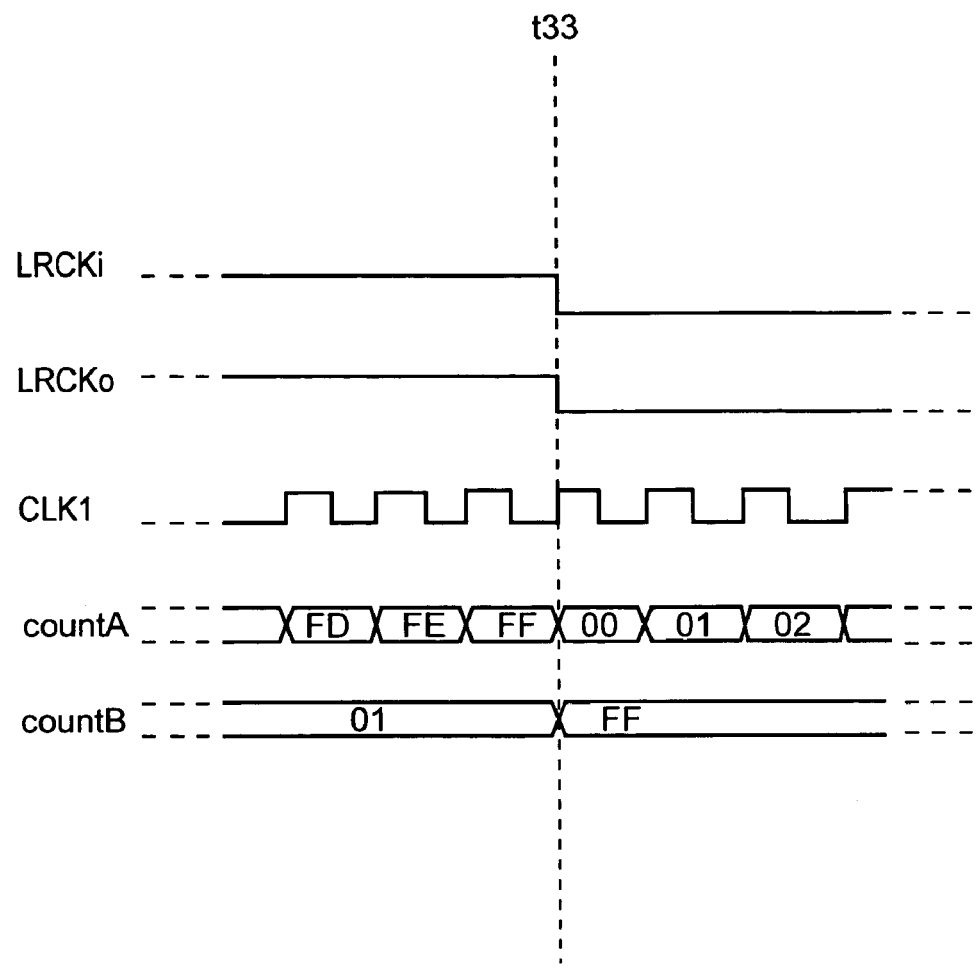
FIG. 6 is a second time chart of the signals of the sampling frequency conversion device according to the first embodiment of the present invention when the sampling frequency fs 1 is higher than the sampling frequency fs 2.

Operations of the above described sampling frequency conversion device according to this embodiment will be described with reference to FIGS. 1 to 6. FIGS. 2 to 6 are time charts illustrating signals of the sampling frequency conversion device according to this embodiment. FIG. 2 illustrates a case where the sampling frequencies fs 1 and fs 2 are equal. FIGS. 3 and 4 illustrate cases where the sampling frequency fs 1 is lower than the sampling frequency fs 2. FIGS. 5 and 6 illustrate cases where the sampling frequency fs 1 is higher than the sampling frequency fs 2. In FIGS. 2 to 6, the counter value countA of counter 7 and the value of the output data countB of register 8 are shown by hexadecimal number. The description will be made on the premise that an initial value of the counter value countA of counter 7 shall be 00 (described by hexadecimal number).

First, the operation of the sampling frequency conversion device according to this embodiment in the case where the sampling frequencies fs 1 and fs 2 are equal will be described with reference to FIG. 2.

The counter value countA of counter 7 repeats counts from 00 to FF (hexadecimal number) at a cycle equal to that of the output word clock LRCKo (time from time t11 to time t12).

When the input word clock LRCKi drops at time t12, the counter value FF (hexadecimal number) of counter 7 at time t12 is held in register 8 in synchronization with this drop.

Similarly to time t12, also at time t13, the counter value FF (hexadecimal number) of counter 7 at time t13 is held in register 8 in synchronization with the drop of the input word clock LRCKi.

When the sampling frequencies fs 1 and fs 2 are equal, the counter value countA of counter 7 at the time when the input word clock LRCKi drops becomes constant, and the output data countB of register 8 does not change.

Next, the operation of the sampling frequency conversion device according to this embodiment in the case where the sampling frequency fs 1 is lower than the sampling frequency fs 2 will be described with reference to FIGS. 3 and 4. FIG. 3 is a time chart of signals immediately after the operation start of the sampling frequency conversion device according to this embodiment. FIG. 4 is a time chart of the signals when a predetermined time has passed from the state shown in FIG. 3.

If the sampling frequency fs 1 is lower than the sampling frequency fs 2, the advance of the input word clock LRCKi becomes slower relative to the output word clock LRCKo. FIG. 3 illustrates a case where the advance of the input word clock LRCKi is delayed by two cycles of the counter clock CLK1 per one sample of the input data Di.

Therefore, the counter value countA of counter 7 which took on 01 (hexadecimal number) at time t21 at which the input word clock LRCKi dropped for the first time becomes 03 (hexadecimal number) at time t22 at which the input word clock LRCKi drops for the second time. Specifically, the timing at which the counter value countA is held in register 8 is delayed by two cycles of the counter clock CLK1 every one cycle of the input word clock LRCKi, and the output data countB of the register 8 increases two by two.

When the sampling frequency fs 1 is lower than the sampling frequency fs 2, the output data countB of register 8 increases depending on the phase shift amount between the input word clock LRCKi and the output word clock LRCKo.

By increasing the output data countB of register 8 two by two, the output data countB of register 8 becomes FF (hexadecimal number) at time t23 of the 128-th drop of the input word clock LRCKi.

Next, the operation of the sampling frequency conversion device according to this embodiment in the case where the sampling frequency fs 1 is higher than the sampling frequency fs 2 will be described with reference to FIGS. 5 and 6. FIG. 5 is a time chart of signals immediately after the operation start of the sampling frequency conversion device according to this embodiment, and FIG. 6 is a time chart of signals when a predetermined time has passed from the state shown in FIG. 5.

When the sampling frequency fs 1 is higher than the sampling frequency fs 2, the advance of the input word clock LRCKi becomes faster relative to the output word clock LRCKo. FIGS. 5 and 6 show cases where the advance of the input word clock LRCKi is faster by two cycles of the counter clock CLK1 per one sample of the input data Di.

The counter value countA of counter 7 which took on FD (hexadecimal number) at time t31 at which the input word clock LRCKi dropped for the first time becomes FB (hexadecimal number) at time t32 at which the input word clock LRCKi drops for the second time. Specifically, the timing at which the counter value countA is held in register 8 becomes faster by two cycles of the counter clock CLK1 every one cycle of the input word clock LRCKi, and the output data countB of register 8 decrease two by two.

When the sampling frequency fs 1 is higher than the sampling frequency fs 2, the output data countB of register 8 decreases depending on the phase shift amount between the input word clock LRCKi and the output word clock LRCKo.

By decreasing the output data countB of register 8 two by two, the output data countB of register 8 becomes FF (hexadecimal number) at time t33 of the 128-th drop of the input word clock LRCKi.

As described above, the transition of the output data countB of register 8 indicates the phase shift between the input data Di and the output data Do. For example, when the output data countB increases by 256, the increase of the output data countB indicates that the input data Di is delayed by one sample behind the output data Do. When the output data countB decreases by 256, the decrease of the output data countB indicates that the input data Di advances ahead of the output data Do by one sample. Therefore, DSP 2 can detect the phase shift amount effectively between the input data Di and the output data Do by referring to the output data countB of register 8 every time of a digital signal processing for one sample of the input data Di. Furthermore, based on the detection result, DSP 2 can execute the correction processing (thinning-out processing or interpolation processing) of the output data.

The sampling frequency conversion device according to this embodiment can notify the DSP 2 of the phase shift amount between the input data Di and the output data Do by counter 7 and register 8. Therefore, the sampling frequency conversion device according to this embodiment can reduce the burden of DSP 2, which is required to detect the phase shift amount between the input data Di and the output data Do, and can operate DSP 2 stably.

The sampling frequency conversion device according to this embodiment executes the interpolation processing of the data when the phase shift amount between the input data Di and the output data Do reaches an amount equivalent to one sample. Therefore, the sampling frequency conversion device according to this embodiment can execute a signal processing of the input data Di without creating discontinuity of data even when the sampling frequencies fs 1 and fs 2 are different.

The sampling frequency conversion device according to this embodiment equalizes the frequency of the counter clock CLK1 with the frequency of the output word clock LRCKo multiplied by 256. Specifically, the sampling frequency conversion device equalizes the frequency of the counter clock LRCK1 with the frequency of the output word clock LRCKo multiplied by 2 to a power, and allows counter 7 to overflow at an equal cycle to that of the output word clock LRCKo. The output data countB of register 8 at the time when the phase shift amount between the input data Di and the output data Do reaches to an amount equivalent to one sample becomes constant. Therefore, the detection of the phase shift amount from the output data countB of register 8 becomes easy, and the burden on DSP 2 can be effectively decreased.

In this embodiment, while DSP 2 is mentioned as the example of the internal circuit, the internal circuit is not limited to DSP 2.

In this embodiment, while the counter value countA of register 7 is held in register 8 in synchronization with the drop of the input word clock LRCKi, the way how to hold the counter value countA is not limited to this. The counter value countA of counter 7 may be held in register 8 in synchronization with a rise of the input word clock LRCKi.

In this embodiment, while the frequency of the counter clock CLK1 is equalized with the frequency of the output word clock LRCK0 multiplied by 256, the frequency of the counter clock CLK1 is not limited to this. The frequency of the counter clock CLK1 may be equalized with the frequency of the output word clock LRCKo multiplied by n (n: integer equal to two or more). For example, even when the frequency of the counter clock CLK1 is equalized with the frequency of the output word clock LRCKo multiplied by 256, it is possible to detect that the input data Di advances ahead of the output data Do by one sample, when the output data countB of register 8 decreases by 128. Moreover, it is possible to detect that the input data Di is delayed by one sample behind the output data Do when the output data countB of resister 8 increases by 128.

In this embodiment, while an 8-bit counter is used as counter 7, counter 7 is not limited to this. For example, also when a 9 (or more)-bit counter is used as counter 7, the same effects as in the case where the 8-bit counter is used can be obtained by resetting counter 7 in synchronization with the output word clock LRCKo.

In this embodiment, while the initial value of the counter value countA of the counter 7 is set to 00 (hexadecimal number), this initial value is not limited to 00 (hexadecimal number).

In this embodiment, while the internal clock CLK0 is generated inside sampling frequency conversion device 1 by internal clock generation circuit 3, the generation of the clock is not limited to this. A clock inputted from the outside of sampling frequency conversion device 1 may be used as the internal clock CLK0.

Second Embodiment

The sampling frequency conversion device according to a second embodiment of the present invention will be described with reference to FIGS. 7 to 14.

Figure 7:
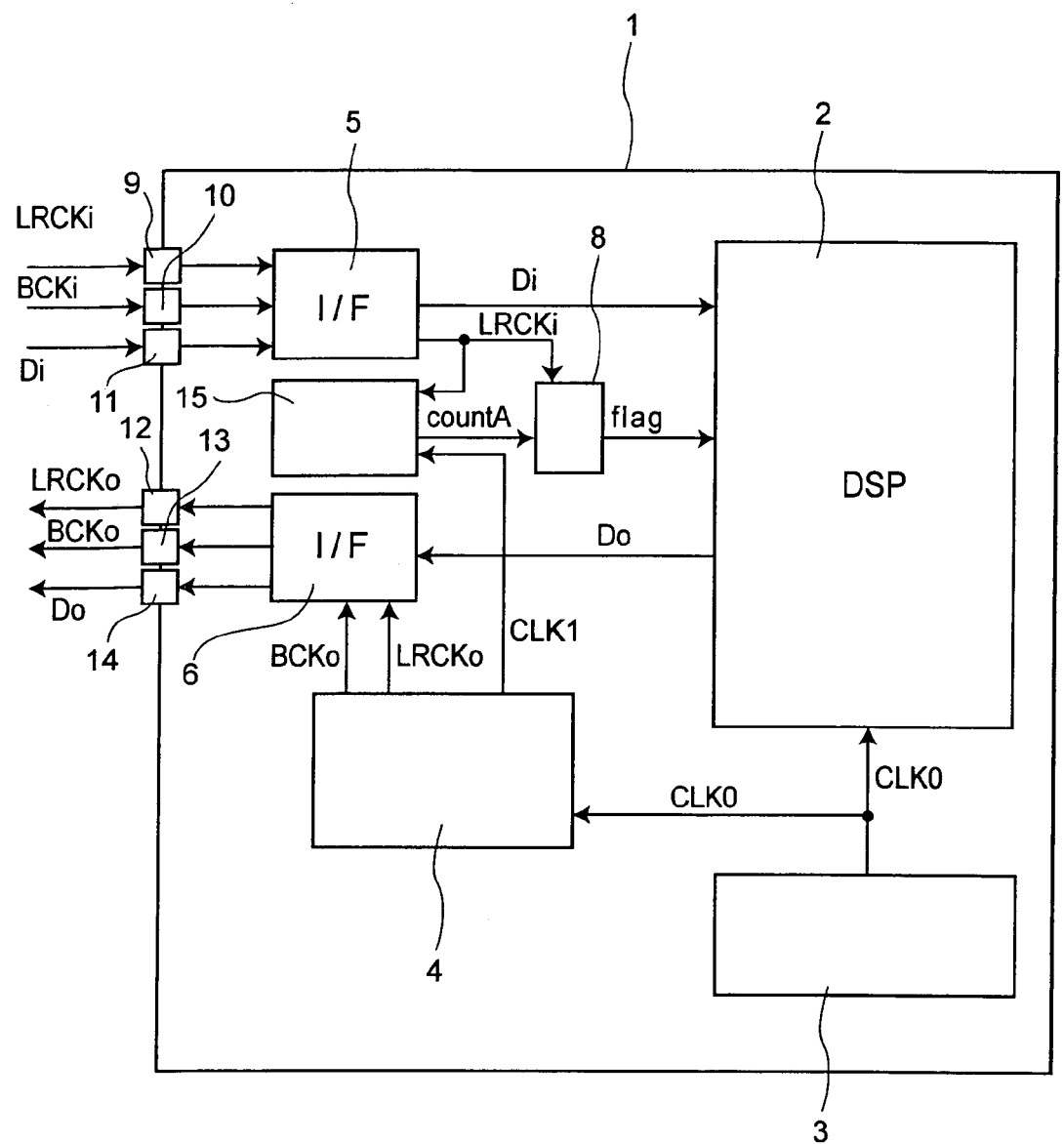
FIG. 7 is a block diagram showing a configuration of a sampling frequency conversion device according to a second embodiment of the present invention.

A configuration of the sampling frequency conversion device according to this embodiment will be described with reference to FIG. 7. FIG. 7 is a block diagram showing the configuration of the sampling frequency conversion device according to this embodiment. It is noted that the same constituent components as those described by use of FIG. 1 in the first embodiment are denoted by the same reference numerals, and descriptions for them are omitted.

A counter 15 (a first counter) is a 10-bit counter, and counts up in synchronization with a counter clock CLK1. An input word clock LRCKi is inputted from an I/F circuit 5 to the counter 15, and higher-order 2 bits of a counter value countA of counter 15 are shifted to a lower-order by one bit in synchronization with a drop of the input word clock LRCKi. Specifically, the counter value countA of counter 15 is subtracted by 256 in synchronization with a drop of the input word clock LRCKi. Here, the description will be made on the premise that an initial value of the counter value countA of counter 15 shall be 100 (hexadecimal number).

A register 16 fetches the counter value countA of counter 15 in synchronization with the drop of the input word clock LRCKi, and holds it as a counter value countB. Subsequently, register 16 detects an overflow or an underflow of lower-order 8 bits from data of the higher-order 2 bits of the held counter value countB, and outputs a flag signal flag to a DSP 2. Register 16 outputs the flag signal flag to DSP 2 when the counter value countB comes to take a value out of a predetermined range. The predetermined range at this time differs depending on the initial value of the counter value countA. For example, when the initial value of the counter value countA is set to 100 (hexadecimal number), this range is from 000 to 1FF (hexadecimal number). A high-order 2 bit data of the counter value countB may be used as the flag signal flag as it is. Moreover, a signal newly generated from the higher-order 2 bit data of the counter value countB may be used.

Figure 8:
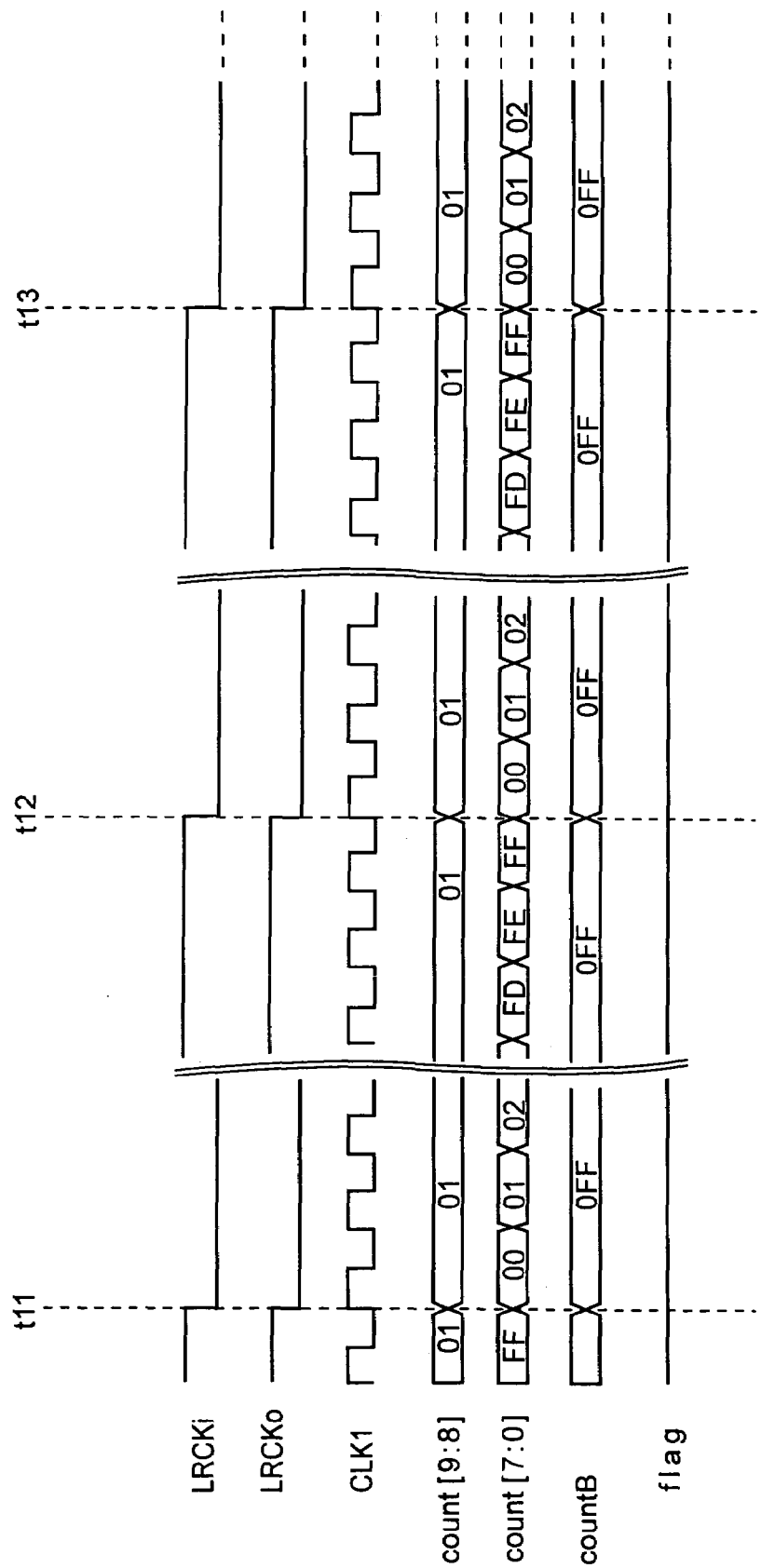
FIG. 8 is a time chart of signals of the sampling frequency conversion device according to the second embodiment of the present invention when the sampling frequency fs 1 is equal to the sampling frequency fs 2.
Figure 9:
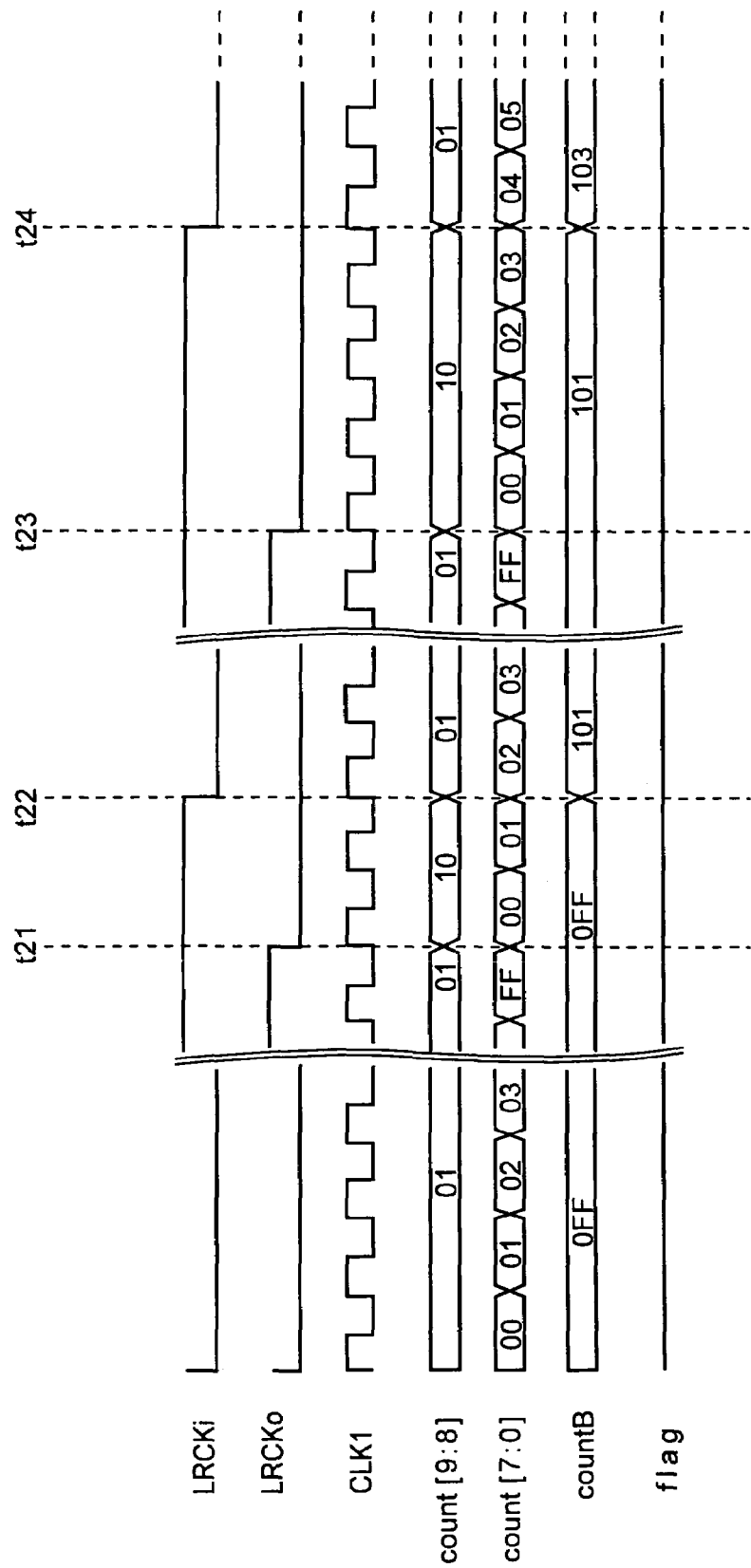
FIG. 9 is a first time chart of the signals of the sampling frequency conversion device according to the second embodiment of the present invention when the sampling frequency fs 1 is lower than the sampling frequency fs 2.
Figure 10:
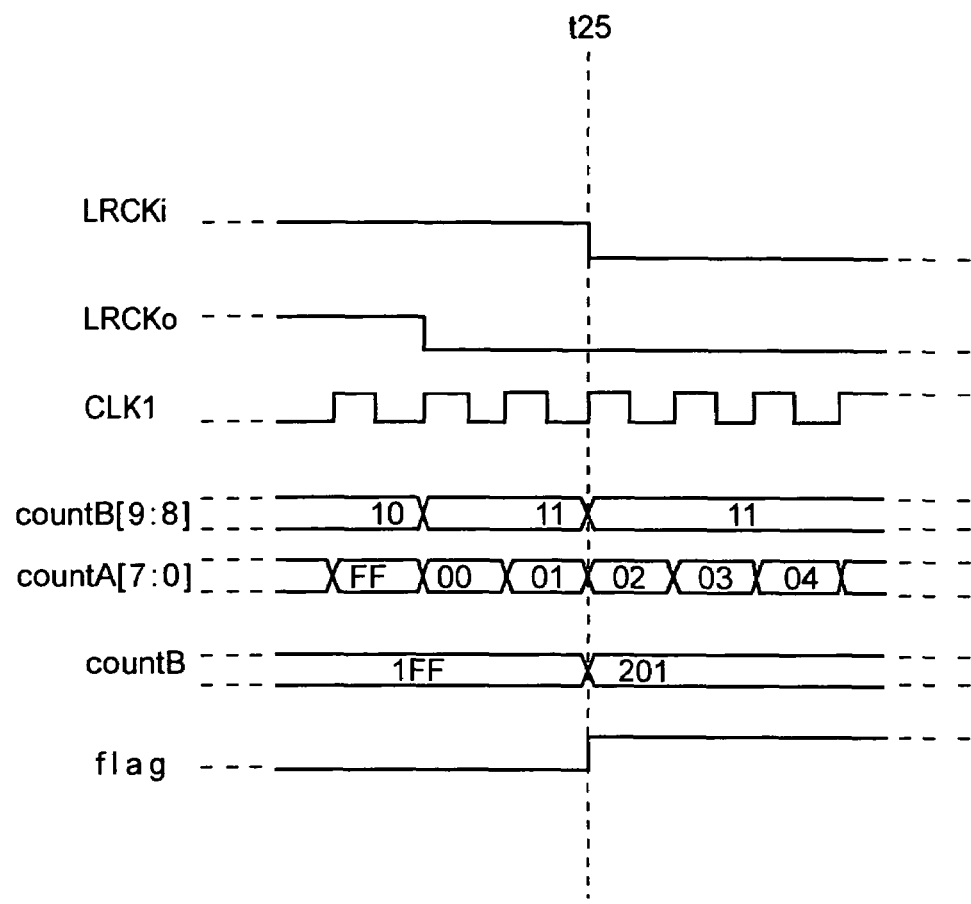
FIG. 10 is a second time chart of the signals of the sampling frequency conversion device according to the second embodiment of the present invention when the sampling frequency fs 1 is lower than the sampling frequency fs 2.
Figure 11:
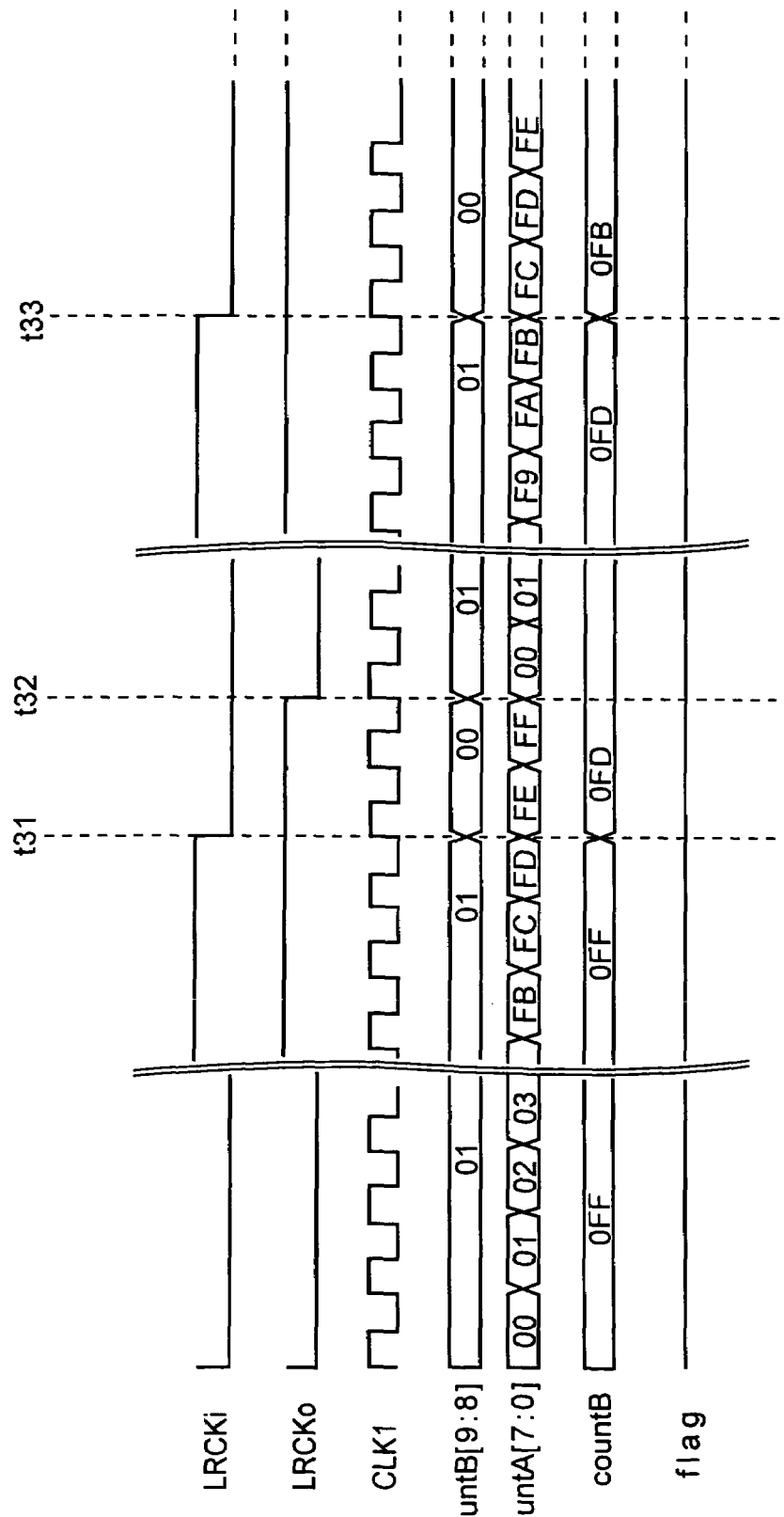
FIG. 11 is a first time chart of the signals of the sampling frequency conversion device according to the second embodiment of the present invention when the sampling frequency fs 1 is higher than the sampling frequency fs 2.
Figure 12:
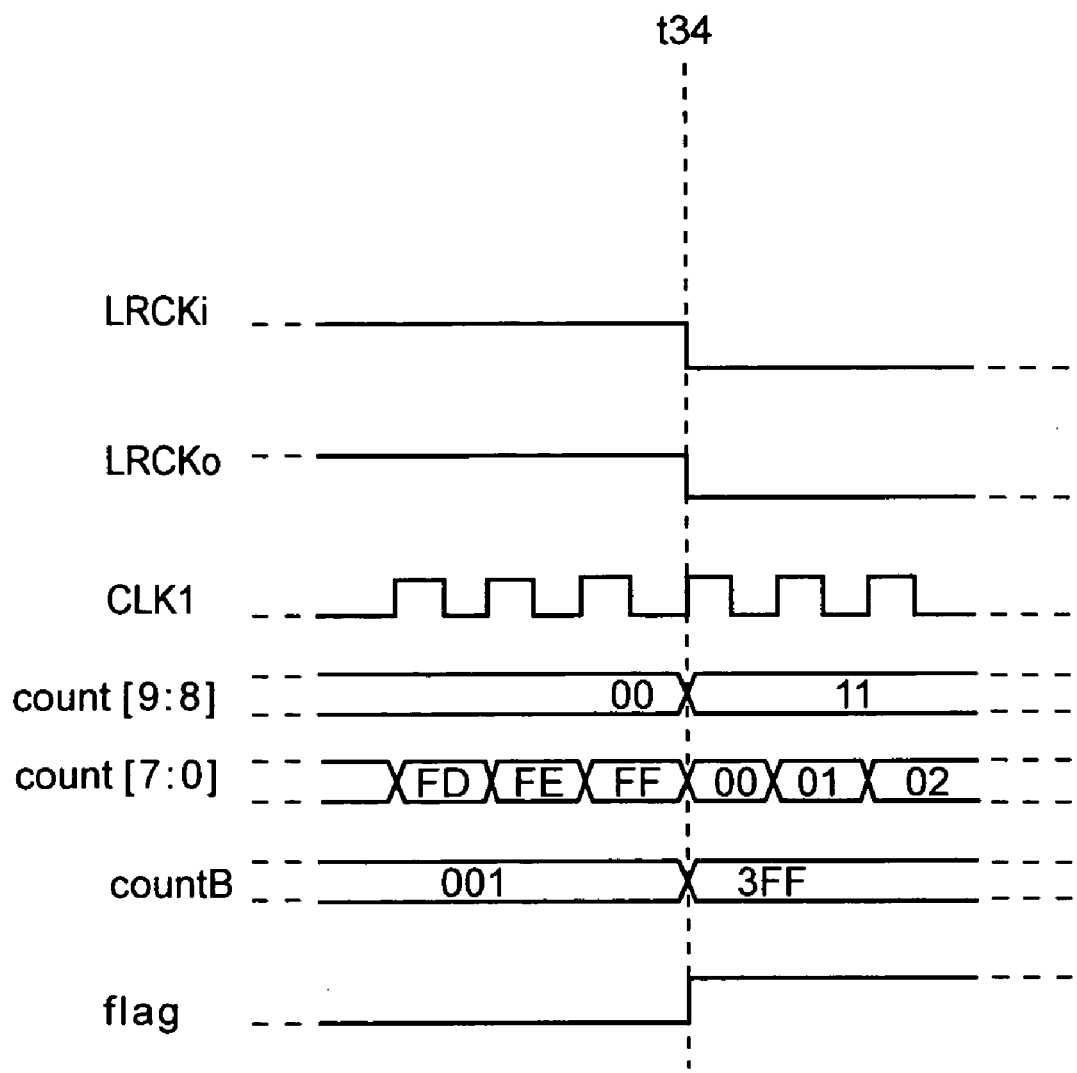
FIG. 12 is a second time chart of the signals of the sampling frequency conversion device according to the second embodiment of the present invention when the sampling frequency fs 1 is higher than the sampling frequency fs 2.

An operation of the sampling frequency conversion device according to this embodiment will be described with reference to FIGS. 7 to 12. FIGS. 8 to 12 are time charts showing signals of the sampling frequency conversion device according to this embodiment. FIG. 8 shows a case where sampling frequencies fs 1 and fs 2 are equal. FIGS. 9 and 10 show cases where the sampling frequency fs 1 is lower than the sampling frequency fs 2. FIGS. 11 and 12 show cases where the sampling frequency fs 1 is higher than the sampling frequency fs 2.

In FIGS. 8 to 12, a lower-order 8 bit value of the counter value countA of counter 15 is expressed by count[7:0] in the form of hexadecimal number and a higher-order 2 bit value thereof is expressed by count[9:8] in the form of binary number. Moreover, the counter value countB held in register 16 is expressed by hexadecimal number.

First, an operation of the sampling frequency conversion device according to this embodiment in the case where the sampling frequencies fs 1 and fs 2 are equal will be described with reference to FIG. 8.

The counter value count[7:0] of the lower-order 8 bits of counter 15 repeats counts from 00 to FF (hexadecimal number) at a cycle equal to that of the output word clock LRCKo (time from time t11 to time t12).

The counter value count[7:0] of the lower-order 8 bits of counter 15 overflows at time t11, the counter value count [9:8] of the higher-order 2 bits is shifted to a higher-order by one bit. However, the input word clock LRCKi drops simultaneously with this overflow, and the counter value count[9:8] of the higher-order 2 bits of counter 15 is shifted to a lower-order by one bit in synchronization with the drop of the input word clock LRCKi. Therefore, the counter value countA at time t11 becomes 0FF (hexadecimal number), and this value is held in register 16.

As in the case with time t11, the counter value count[9:8] of the higher-order 2 bits is shifted to the lower-order by one bit along with the overflow of the counter value count[7:0] of the lower-order 8 bits also at time t12 and time t13. Therefore, also the counter value countA of counter 15 at time t12 and time t13 becomes 0FF (hexadecimal number), and this value is held in register 16.

In the case where the sampling frequencies fs 1 and fs 2 are equal, the counter value countA of counter 15 at the time of the drop of the input word clock LRCK1 becomes constant, and the counter value countB held in register 16 does not change.

Next, an operation of the sampling frequency conversion device according to this embodiment when the sampling frequency fs 1 is lower than the sampling frequency fs 2 will be described with reference to FIGS. 9 and 10. FIG. 9 is a time chart of signals immediately after the operation start of the sampling frequency conversion device according to this embodiment, and FIG. 10 is a time chart of signals when a predetermined time has passed from the state shown in FIG. 9.

When the sampling frequency fs 1 is lower than the sampling frequency fs 2, the advance of the input word clock LRCKi is delayed behind the output word clock LRCKo. FIGS. 9 and 10 show cases where the advance of the input word clock LRCKi is delayed by two cycles of the counter clock CLK1 per one sample of the input data Di.

The counter value count[7:0] of the lower-order 8 bits of counter 15 overflows at time t21 before the input word clock LRCKi first drops, and the counter value count[9:8] of the higher-order 2 bits is shifted to the higher-order by one bit. The input word clock LRCKi drops at time t22, and in synchronization with the drop, the counter value count[9:8] of the higher-order 2 bits of counter 15 is shifted to the lower-order by one bit, and the counter value 101 (hexadecimal number) of counter 15 is held in register 16.

Similarly, the second overflow of the counter value count [7:0] of the lower-order 8 bits of counter 15 occurs at time t23, and the input word clock LRCKi drops at time t24, whereby the counter value countB of register 16 which took on 101 (hexadecimal number) at time t22 becomes 103 (hexadecimal number) at time t24. Specifically, the timing at which the counter value countA is held in register 16 is delayed by two cycles of the counter clock CLK1 per one cycle of the input word clock LRCK1, and the counter value countB of register 16 increases two by two.

In the case where the sampling frequency fs 1 is lower than the sampling frequency fs 2, the counter value countB of register 16 increases depending on the phase shift amount between the input word clock LRCKi and the output word clock LRCKo.

By increasing the counter value of register 16 two by two, at time t25 of the 129-th drop of the input word clock LRCKi, the counter value countB of the register 16 becomes 201 (hexadecimal number), and the higher-order 2 bit value of the counter value countB becomes 10 (binary number) and is shifted to the higher-order by one bit. Register 16 detects the overflow of the counter value count[7:0] of the lower-order 8 bits of counter 15 by the shift of the higher-order 2 bits to the higher-order, and outputs the flag signal flag to DSP 2 at time t25. By this flag signal flag, DSP 2 detects that the input data Di is delayed by one sample behind the output data Do, and executes the thinning-out processing of the output data Do.

Next, an operation of the sampling frequency conversion device according to this embodiment when the sampling frequency fs 1 is higher than the sampling frequency fs 2 will be described with reference to FIGS. 11 and 12. FIG. 11 is a time chart of signals immediately after the operation start of the sampling frequency conversion device according to this embodiment, and FIG. 12 is a time chart of signals when a predetermined time has passed from the state shown in FIG. 11.

When the sampling frequency fs 1 is higher than the sampling frequency fs 2, the input word clock LRCKi advances ahead of the output word clock LRCKo. FIGS. 11 and 12 show cases where the input word clock LRCKi advances by two cycles of the counter clock CLK1 per one sample of the input data Di.

The input word clock LRCKi drops at time t31 before the counter value count[7:0] of the lower-order 8 bits of counter 15 overflows, and the counter value count[9:8] of the higher-order 2 bits of counter 15 is shifted to the lower-order by one bit. The counter value 0FD (hexadecimal number) of counter 15 is held in register 16. The counter value count [7:0] of the lower-order 8 bits of counter 15 overflows at time t32 after the holding of the counter value 0FD, and the counter value count[9:8] of the higher-order 2 bits of counter 15 is shifted to the higher-order by one bit.

Similarly, at time t33 of the second drop of the input word clock LRCKi, the counter value 0FA (hexadecimal number) of counter 15 after the counter value count[9:8] of the higher-order 2 bits is shifted to the lower-order is held in register 16. Thereafter, the counter value count[7:0] of the lower-order 8 bits of counter 15 overflows. Specifically, the timing at which the counter value countA is held in register 16 is delayed by two cycles of the counter clock CLK1 every one cycle of the input word clock LRCKi, and the counter value countB of register 16 decreases two by two.

When the sampling frequency fs 1 is lower than the sampling frequency fs 2, the counter value countB of register 16 decreases depending on the phase shift amount between the input word clock LRCKi and the output word clock LRCKo.

By decreasing the counter value countB of register 16 two by two, at time t34 of the 128-th drop of the input word clock LRCKi, the counter value countB of register 16 becomes 3FF (hexadecimal number), and the higher-order 2 bit value of the counter value countB becomes 11 (binary number) and is shifted to the lower-order by one bit. Register 16 detects the underflow of the counter value count[7:0] of the lower-order 8 bits of counter 15 by the shift of the higher-order 2 bits to the lower-order, and outputs the flag signal flag to DSP 2 at time t34. By this flag signal flag, DSP 2 detects that the input data Di advances by one sample ahead the output data Do, and executes the interpolation processing of the output data Do.

In the sampling frequency conversion device according to this embodiment, register 16 outputs the flag signal flag to DSP 2 when the phase shift of one or more samples occurs between the input data Di and the output data Do, that is, when the counter value countB becomes a value other than 000 to 1FF (hexadecimal number). Therefore, the sampling frequency conversion device according to this embodiment doesn't require DSP 2 to detect the phase shift between the input data Di and the output data Do, and is capable of reducing the burden on DSP 2 and operating DSP 2 stably.

The sampling frequency conversion device according to this embodiment equalizes the frequency of the counter clock CLK1 with the frequency of the output word clock LRCKo multiplied by 256. Specifically, the sampling frequency conversion device equalizes the frequency of the counter clock LRCK1 with the frequency of the output word clock LRCKo multiplied by 2 to a power. Moreover, the sampling frequency conversion device according to this embodiment sets an initial value of the counter value countA of counter 15 to 100 (hexadecimal number). In other words, the sampling frequency conversion device according to this embodiment sets an initial value of the lower-order 8 bits of the counter value countA to 00 (hexadecimal number). With such device, it is possible to detect only by higher-order 2 bits of the counter value countB held in register 16 whether the phase shift between the input data Di and the output data Do reaches an amount equivalent to one sample. Therefore, the flag signal flag can be generated more easily.

The sampling frequency conversion device according to this embodiment can achieve the same effects as those of the sampling frequency conversion device of the first embodiment in regard to other effects.

Figure 13:
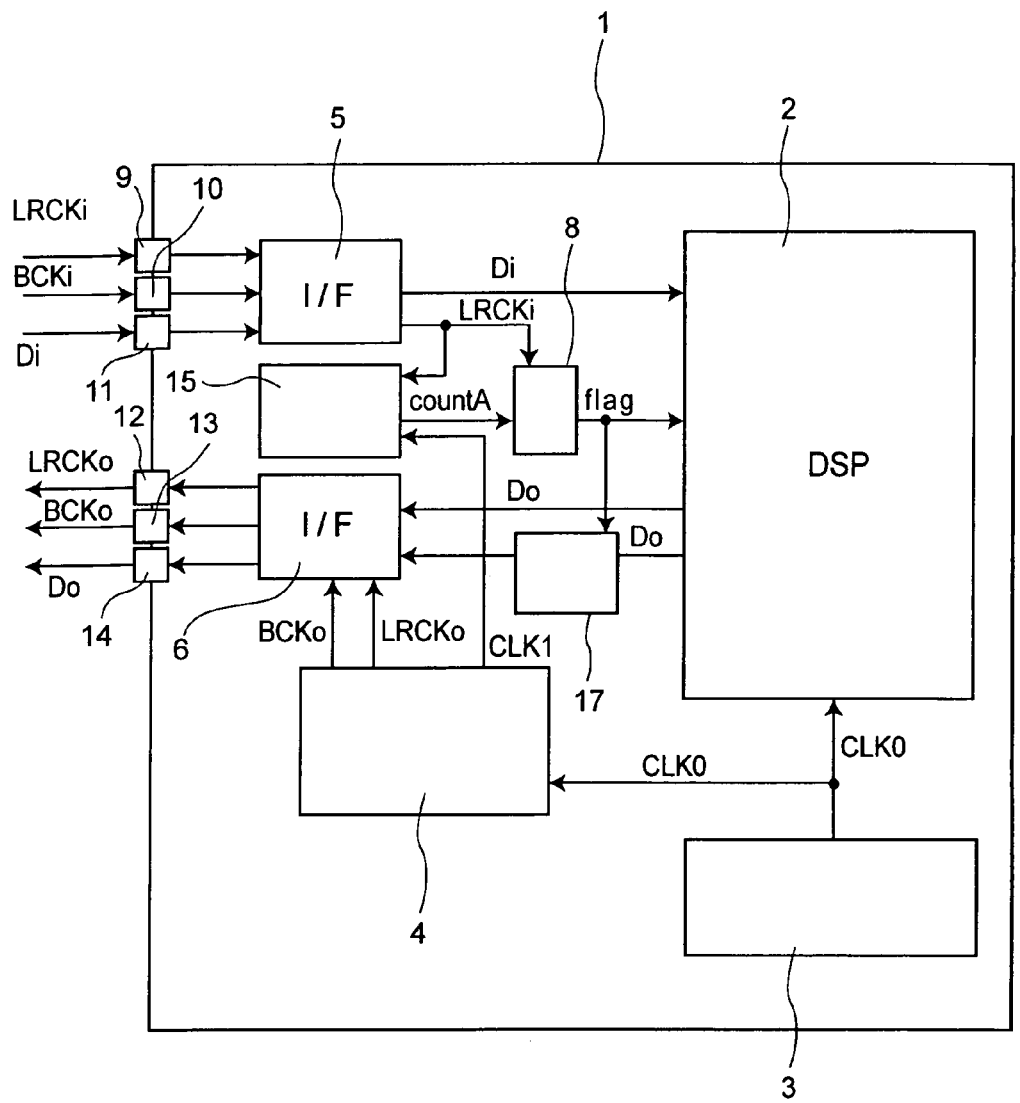
FIG. 13 is a block diagram showing a configuration of a sampling frequency conversion device according to a first modification of the second embodiment of the present invention.

Next, a sampling frequency conversion device according to a first modification of this embodiment will be described with reference to FIG. 13. FIG. 13 is a block diagram showing the configuration of the sampling frequency conversion device according to the first modification of this embodiment.

A correction circuit 17 is provided between DSP 2 and I/F circuit 6. Correction circuit 17 executes a correction processing (thinning-out processing or interpolation processing) of data when the phase shift of one or more samples occurs between the input data Di and the output data Do.

To be concrete, when the higher-order 2 bit value of the counter value countB of register 16 becomes 10 (binary number), in other words, when the input word clock LRCKi advances by one or more samples ahead of the output word clock LRCKo, the output data Do is outputted through correction circuit 17, so that the thinning-out processing of the output data Do is executed by correction circuit 17. On the other hand, when the higher-order 2 bit value of the counter value countB of register 16 becomes 11 (binary number), in other words, when the input word clock LRCKi is delayed by one or more samples behind the output word clock LRCKo, the output data Do is outputted through correction circuit 17, so that the interpolation processing of the output data Do is executed by correction circuit 17. It is noted that the higher-order 2 bit value of the counter value countB is either 00 or 01 (binary number), the output data Do is outputted to I/F circuit 6 without allowing the output data to pass through correction circuit 17.

With the provision of such correction circuit 17, it is unnecessary to allow DSP 2 to execute the correction processing of data by use of firmware, and the conversion of the sampling frequency can be executed without placing burden on DSP 2.

Figure 14:
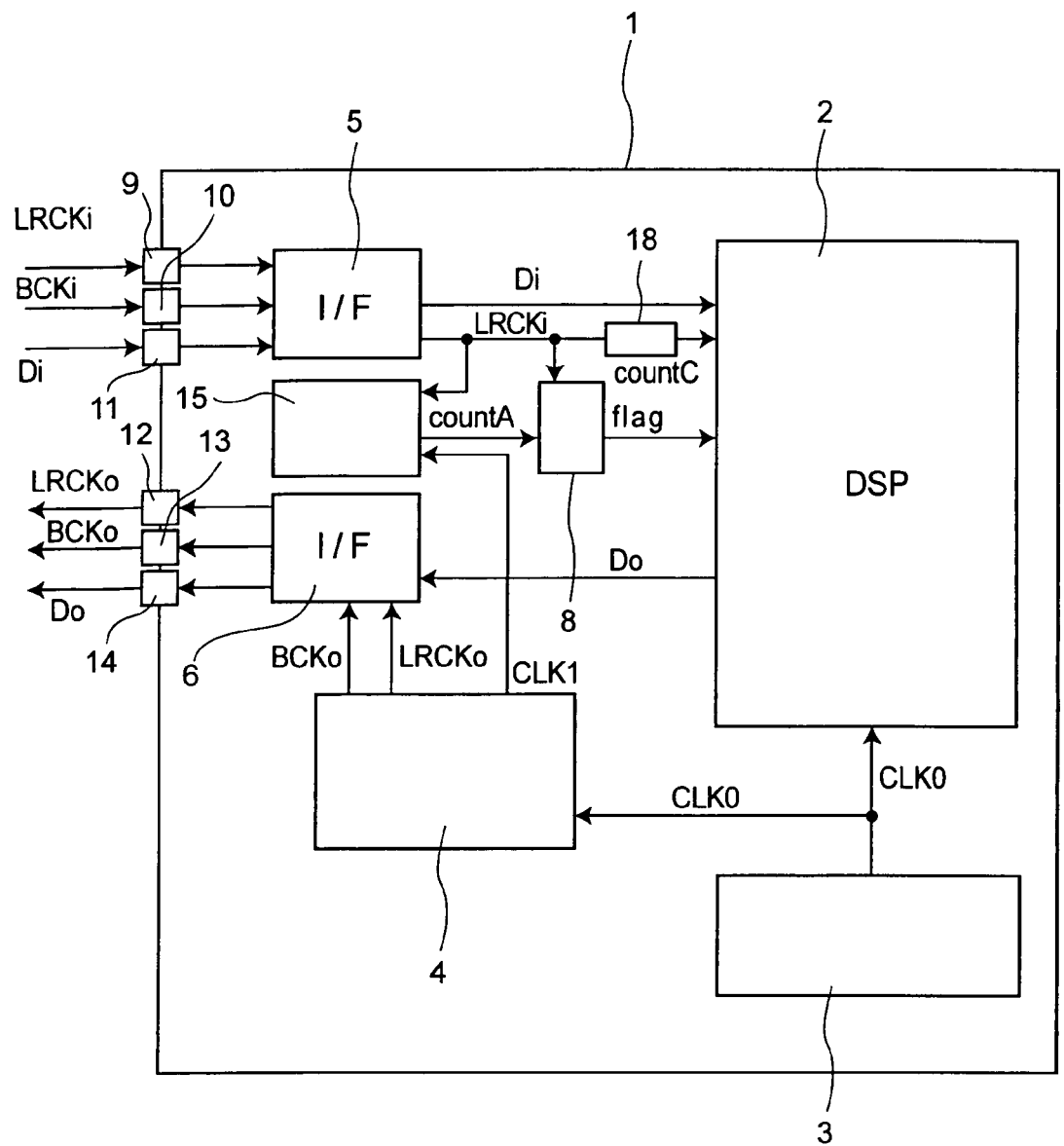
FIG. 14 is a block diagram showing a configuration of a sampling frequency conversion device according to a second modification of the second embodiment of the present invention.

Next, a sampling frequency conversion device according to a second modification of this embodiment will be described with reference to FIG. 14. FIG. 14 is a block diagram showing a configuration of the sampling frequency conversion device according to the second modification of this embodiment.

Counter 18 (a second counter) counts up in synchronization with the input word clock LRCKi. The counter value countC of counter 18 is outputted to DSP 2.

DSP 2 calculates the phase shift amount between the input word clock LRCKi and the output word clock LRCKo based on the counter value countC of counter 18 at the time when the flag signal flag is inputted from counter 18. For example, on the precondition that the flag signal flag is outputted when the phase shift between the input word clock LRCKi and the output word clock LRCKo is one sample (2 Π) or more, the phase shift between the input word clock LRCKi and the output word clock LRCKo is calculated to beΠ/500 when the counter value countC of counter 18 is 1000 at the time of the input of the flag signal flag. Then, DSP 2 executes the correction processing of data by executing a correction processing program depending on the calculated phase shift.

The sampling frequency conversion device according to the second modification of this embodiment can make a prediction about the phase shift amount between the input word clock LRCKi and the output word clock LRCKo. Therefore, DSP 2 can find out beforehand what kind of the correction processing is necessary every one sample, and the detection of the phase shift amount between the input word clock LRCKi and the output word clock LRCKo is not required for DSP 2 during a normal operation of the device.

In this embodiment, the following case was presented. Specifically, when the phase shift between the input data Di and the output data Do, which has an amount equivalent to one sample or more, is produced, that is, when the higher-order 2 bit value of the counter value countB held in register 16 becomes 10 or 11 (binary number), the flag signal flag is outputted to DSP 2. However, the condition that this flag signal flag is outputted is not limited to the case where the phase shift equivalent to one or more samples is produced between the input data Di and the output data Do. It is possible to generate the flag signal flag for smaller phase shift by using not only the higher-order 2 bit value of the counter value countB but also a lower-order bit value for the detection of the phase shift.

For example, in the case where a higher-order 3 bit value of the counter value countB is used for detecting the phase shift, assuming that an initial value of the counter value countA of counter 15 is 100 (hexadecimal number), it is possible to detect that the input word clock LRCKi is delayed by n behind the output word clock LRCKo, when the higher-order 3 bit value of the counter value countB becomes 011 (binary number). Furthermore, when the higher-order 3 bit value of the counter value countB becomes 000 (binary number), it is possible to detect that the input word clock LRCKi advances by Π ahead of the output word clock LRCKo. Similarly, by using not only the higher-order 3 bit value but also a higher-order 4 bit value for the detection of the phase shift, it is also possible to generate the flag signal flag when the phase shift becomes Π/2.

In this embodiment, though the initial value of the counter value countA of counter 15 is set to 100 (hexadecimal number), this initial value is not limited to 100 (hexadecimal number). For example, in the case where the initial value of the counter value countA is set to 200 (hexadecimal number), register 16 outputs the flag signal flag to DSP 2 when the counter value countB takes a value other than 100 to 2FF (hexadecimal number), whereby the same effects as those achieved in the case where the initial value of the counter value countA is set to 100 (hexadecimal number) can be achieved.

In this embodiment, while the frequency of the counter clock CLK1 is equalized with that of the output word clock LRCKo multiplied by 256, the frequency of the counter clock CLK1 is not limited to this as in the case of the first embodiment. The frequency of the counter clock CLK1 may be equalized with that of the output word clock LRCKo multiplied by n (n: integer equal to two ore more).

In this embodiment, while the counter value countA of counter 15 is subtracted by 256 in synchronization with the input word clock LRCKi, the value subtracted from the counter value countA is not limited to 256. As long as the frequency of the counter clock CLK1 is equalized with that of the output word clock LRCKo multiplied by n (n: integer equal to two or more), n may be subtracted from the counter value countA of counter 15 in synchronization with the input word clock LRCKi.

In this embodiment, though DSP 2 is mentioned as the example of the internal circuit, the internal circuit is not limited to DSP 2 as in the case of the first embodiment.

In this embodiment, though the counter value countA of counter 15 is held in register 16 in synchronization with the drop of the input word clock LRCKi, the way how to hold the counter value countA is not limited to this. The counter value countA of counter 15 may be held in register 16 in synchronization with a rise of the input word clock LRCKi.

In this embodiment, though the 10 bit counter is employed as counter 15, counter 15 is not limited to this.

In this embodiment, though the internal clock CLK0 is generated by internal clock generation circuit 3 in the inside of sampling frequency conversion device 1, the way how to generate the internal clock CLK0 is not limited to this as in the case of the first embodiment.

The present invention can be modified without departing from spirit and scope of the present invention in implementing the present invention.

Other embodiments of the present invention will be apparent to those skilled in the art from consideration of the specification and practice of the invention disclosed herein. It is intended that the specification and example embodiments be considered as exemplary only, with a true scope and spirit of the invention being indicated by the following.

What is claimed is:

1. A sampling frequency conversion device, comprising:
an internal circuit configured to execute in synchronization with an internal clock a signal processing of input data fetched in accordance with an input word clock, and for outputting the input data having undergone the signal processing as output data;
a clock generation circuit configured to generate from the internal clock an output word clock and a counter clock having a frequency which is equal to that of the output word clock multiplied by n (n: integer equal to two or more);
a first counter configured to count the counter clock and to subtract the integer n from a counted counter value in synchronization with the input word clock; and
a register configured to hold the counter value of the first counter in synchronization with the input word clock, and to output a flag signal to the internal circuit when the held counter value becomes a value out of a predetermined range,
wherein the internal circuit executes a thinning-out processing for one sample of the output data as the correction processing of the output data when the flag signal shows that the input data is delayed by one sample behind the output data, and the internal circuit executes an interpolation processing for one sample of the output data as the correction processing of the output data when the flag signal shows that the input data advances by one sample ahead of the output data.

2. A sampling frequency conversion devices, comprising:
an internal circuit configured to execute in synchronization with an internal clock a signal processing of input data fetched in accordance with an input word clock, and to output the input data having undergone the signal processing as output data;
a clock generation circuit configured to generate from the internal clock an output word clock and a counter clock having a frequency which is equal to that of the output word clock multiplied by n (n: integer equal to two or more);
a first counter configured to count the counter clock and to subtract the integer n from a counted counter value in synchronization with the input word clock;
a register configured to hold the counter value of the first counter in synchronization with the input word clock, and to output a flag signal to the internal circuit when the held counter value becomes a value out of a predetermined range; and
a correction circuit to which the output data is inputted and the flag signal is inputted from the register, the correction circuit executing a thinning-out processing for one sample of the output data as the correction processing of the output data when the flag signal shows that the input data is delayed by one sample behind the output data, and the correction circuit executing an interpolation processing for one sample of the output data as the correction processing of the output data when the flag signal shows that the input data advances by one sample ahead of the output data.

3. The device according to claim 1, further comprising:
a second counter configured to count the input word clock and to output a counter value of the input word clock to the internal circuit,
wherein the internal circuit calculates a phase sift amount between the input data and the output data based on the counter value of the second counter when the flag signal is inputted.

4. The device according to claim 1, wherein the integer n is 2 to a power.

5. The device according to claim 2,
wherein the integer n is 2 to a power.

6. The device according to claim 1,
wherein the register detects an overflow or an underflow of lower-order bits from data of a higher-order bit of the held counter value to output the flag signal.

7. The device according to claim 3,
wherein the register detects an overflow or an underflow of lower-order bits from data of a higher-order bit of the held counter value to output the flag signal.

8. The device according to claim 4,
wherein the register detects an overflow or an underflow of lower-order bits from data of a higher-order bit of the held counter value to output the flag signal.

9. The device according to claim 2,
wherein the register detects an overflow or an underflow of lower-order bits from data of a higher-order bit of the held counter value to output the flag signal.

10. The device according to claim 5,
wherein the register detects an overflow or an underflow of lower-order bits from data of a higher-order bit of the held counter value to output the flag signal.

11. The device according to claim 1,
wherein the internal circuit is a digital signal processor.

12. The device according to claim 3,
wherein the internal circuit is a digital signal processor.

13. The device according to claim 4,
wherein the internal circuit is a digital signal processor.

14. The device according to claim 2,
wherein the internal circuit is a digital signal processor.

15. The device according to claim 14,
wherein the internal circuit is a digital signal processor.

* * * * *